(12) United States Patent
Oh

(10) Patent No.: US 10,998,333 B2
(45) Date of Patent: May 4, 2021

(54) VERTICAL MEMORY DEVICE AND METHOD FOR FABRICATING THE SAME

(71) Applicant: SK hynix Inc., Icheon-si (KR)

(72) Inventor: Kwang-Seok Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 4 days.

(21) Appl. No.: 16/458,785

(22) Filed: Jul. 1, 2019

(65) Prior Publication Data

US 2020/0098788 A1    Mar. 26, 2020

(30) Foreign Application Priority Data

Sep. 21, 2018    (KR) ........................ 10-2018-0114074

(51) Int. Cl.
*H01L 27/11582* (2017.01)
*H01L 23/522* (2006.01)
*H01L 27/11565* (2017.01)

(52) U.S. Cl.
CPC .... *H01L 27/11582* (2013.01); *H01L 23/5226* (2013.01); *H01L 27/11565* (2013.01)

(58) Field of Classification Search
CPC ......... H01L 27/11582; H01L 27/11565; H01L 23/5226
See application file for complete search history.

(56) References Cited

U.S. PATENT DOCUMENTS

| 9,331,082 | B2 | 5/2016 | Lee et al. |
| 9,343,452 | B2 | 5/2016 | Yun et al. |
| 9,953,999 | B2 | 4/2018 | Nam et al. |
| 2020/0075628 | A1* | 3/2020 | Nanami ............ H01L 27/11575 |
| 2020/0091071 | A1* | 3/2020 | Lee ..................... H01L 23/5283 |

* cited by examiner

*Primary Examiner* — Sue A Purvis
*Assistant Examiner* — Scott Stowe
(74) *Attorney, Agent, or Firm* — William Park & Associates Ltd.

(57) ABSTRACT

A vertical memory device includes a substrate, a plurality of gate electrodes vertically stacked over the substrate in a cell array region, and a plurality of multi-layered pad portions formed over the substrate in a contact region. Each multi-layered pad portion of the plurality of multi-layered pad portions extends from an end of a gate electrode of the plurality of gate electrodes. Each multi-layered pad portion of the plurality of multi-layered pad portions includes a lower pad, an upper pad spaced vertically apart from the lower pad, a buffer pad formed between the lower pad and the upper pad, and a pad interconnection portion interconnecting the lower pad and the upper pad.

23 Claims, 14 Drawing Sheets

VERTICAL MEMORY DEVICE AND METHOD FOR FABRICATING THE SAME

CROSS-REFERENCE TO RELATED APPLICATIONS

The present application claims priority to Korean Patent Application No. 10-2018-0114074, filed on Sep. 21, 2018, which is incorporated herein by reference in its entirety.

BACKGROUND

1. Field

Embodiments of the present disclosure relate to a memory device, and more particularly, to a vertical memory device and a method for fabricating the vertical memory device.

2. Description of the Related Art

Recently, vertical memory devices in which memory cells are stacked over a substrate are being developed. The vertical memory devices include contact plugs having different heights to electrically connect the memory cells to each other.

SUMMARY

In accordance with an embodiment of the present teachings, a vertical memory device includes a substrate, a plurality of gate electrodes vertically stacked over the substrate in a cell array region, and a plurality of multi-layered pad portions formed over the substrate in a contact region. Each multi-layered pad portion of the plurality of multi-layered pad portions extends from an end of a gate electrode of the plurality of gate electrodes. Each multi-layered pad portion of the plurality of multi-layered pad portions includes a lower pad, an upper pad spaced vertically apart from the lower pad, a buffer pad formed between the lower pad and the upper pad, and a pad interconnection portion interconnecting the lower pad and the upper pad.

Also in accordance with an embodiment of the present teachings, a method for fabricating a vertical memory device includes forming a plurality of dielectric layers and a plurality of sacrificial layers interleaved over a substrate in a cell array region and a contact region and forming a stepwise structure where the sacrificial layers are exposed by patterning the dielectric layers and the sacrificial layers in the contact region. The method also includes forming a plurality of multi-layer sacrificial structures including a sacrificial material over the exposed sacrificial layers of the stepwise structure and forming a capping layer over the sacrificial structures, wherein the capping layer includes a plurality of air gaps respectively interconnecting the multiple layers of multi-layer sacrificial structures of the plurality of multi-layer sacrificial structures. The method further includes replacing the sacrificial layers in the cell array region with a plurality of gate electrodes and replacing the sacrificial layers, the air gaps, and the multi-layer sacrificial structures in the contact region with a plurality of multi-layered pad portions. The method additionally includes forming a plurality of contact plugs, wherein contact plugs of the plurality of contact plugs are respectively coupled to multi-layered pad portions of the multi-layered pad portions.

For an embodiment, the multi-layered pad portions are thicker than the gate electrodes. Replacing the sacrificial layers, the air gaps, and the multi-layer sacrificial structures in the contact region with a plurality of multi-layered pad portions may include forming lower pads and upper pads which are spaced vertically apart from the lower pads through replacement of the sacrificial layers and the sacrificial material; and forming pad interconnection portions by filling the air gaps to interconnect the lower pads and the upper pads. Replacing the sacrificial layers in the cell array region with a plurality of gate electrodes and replacing the sacrificial layers, the air gaps, and the multi-layer sacrificial structures in the contact region with a plurality of multi-layered pad portions may include forming a slit by etching the capping layer, the plurality of sacrificial layers, and the plurality of dielectric layers; forming a plurality of horizontal recesses by removing the plurality of sacrificial layers in the cell array region through the slit; forming a plurality of stack-type recesses with the air gaps embedded therein by removing the plurality of sacrificial layers and the sacrificial material in the contact region through the plurality of horizontal recesses; and filling the plurality of horizontal recesses and the plurality of stack-type recesses with a conductive material to form the plurality of gate electrodes and the plurality of multi-layered pad portions. Forming the plurality of multi-layer sacrificial structures including a sacrificial material over the exposed sacrificial layers of the stepwise structure may include depositing a sacrificial pad, then depositing a buffer pad, and then depositing an additional sacrificial pad over a sacrificial layer of the plurality of sacrificial layers in the contact region. The sacrificial layer, the sacrificial pad, the buffer pad, and the additional sacrificial pad are formed of the same material. The buffer pad and the plurality of dielectric layers may include silicon oxide, and wherein the plurality of sacrificial layers, the sacrificial pad, the buffer pad, and the additional sacrificial pad may include silicon nitride. Forming a plurality of multi-layer sacrificial structures including a sacrificial material over the exposed sacrificial layers of the stepwise structure may include forming a sacrificial pad layer over a sacrificial layer; etching the sacrificial pad layer to form a sacrificial pad; sequentially depositing a buffer layer and an additional sacrificial pad layer over the sacrificial pad; forming a sacrificial buffer pad over the additional sacrificial pad layer; etching the additional sacrificial pad layer with the sacrificial buffer pad used as an etch mask to form the additional sacrificial pad; and etching the buffer layer to form the buffer pad, wherein the additional sacrificial pad and the sacrificial pad form a multi-layer sacrificial structure of the plurality of the multi-layer sacrificial structures. A method may further include forming, after forming the capping layer, a vertical channel structure that penetrates through the capping layer, the plurality of dielectric layers, and the plurality of sacrificial layers in the cell array region.

DETAILED DESCRIPTION

Figure 1:
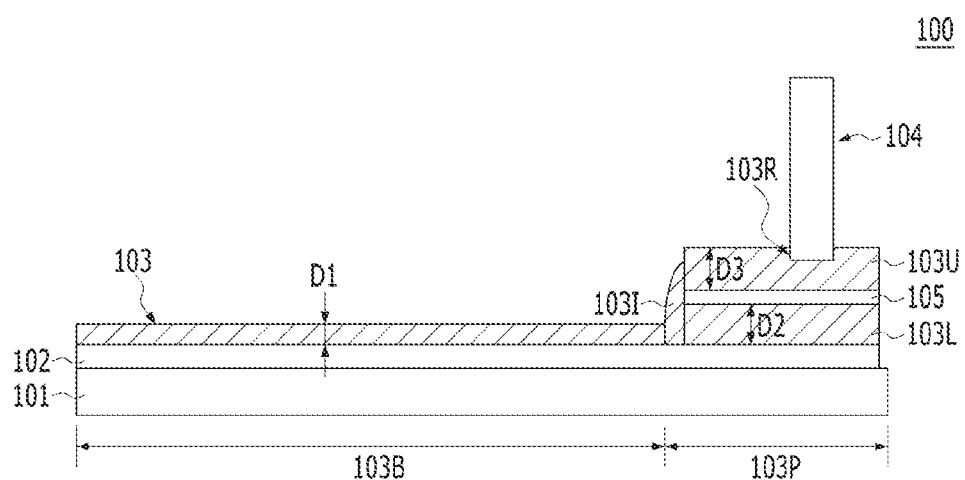
FIG. 1 shows a cross-sectional view illustrating a semiconductor device in accordance with an embodiment of the present teachings.

Embodiments of the present teachings are described below in detail with reference to the accompanying drawings. The present teachings may, however, be embodied in different forms and should not be construed as limited to the embodiments set forth herein. The presented embodiments are provided so that this disclosure will enable those skilled in the art to practice the present teachings without undue experimentation. Throughout the disclosure, like reference numerals refer to like parts illustrated in the various figures.

The figures are not necessarily drawn to scale, and in some instances, relative proportions may be exaggerated in order to clearly illustrate features of an embodiment. When a first layer is referred to as being "on" a second layer or "on" a substrate, it not only refers to a case where the first layer is formed directly on the second layer or the substrate but also a case where a third layer exists between the first layer and the second layer or the substrate.

Various embodiments of the present disclosure are directed to a vertical memory device with improved reliability and a method for fabricating the vertical memory device. For various embodiments, a vertical memory device has memory strings which are vertically oriented, such that at least one memory cell is located over another memory cell. This type of array allows for vertical scaling to provide a higher density of memory cells per unit area of silicon or other semiconductor material.

FIG. 1 shows a cross-sectional view illustrating a semiconductor device, in accordance with an embodiment.

Referring to FIG. 1, a semiconductor device 100 may include a first conductive structure 103 positioned over a substrate 101. A dielectric material 102 may be positioned between the substrate 101 and the first conductive structure 103. The semiconductor device 100 may further include a second conductive structure 104 coupled to the first conductive structure 103.

The first conductive structure 103 may extend horizontally with the substrate 101. The first conductive structure 103 may include a base portion 103B and a pad portion 103P. The pad portion 103P may extend from one end of the base portion 103B. The pad portion 103P may be referred to as 'a contact area'. The pad portion 103P may be thicker than the base 103B. The base portion 103B may be a single layer, and the pad portion 103P may have multiple layers. The base portion 103B and the pad portion 103P may include the same material. The first conductive structure 103 may include a semiconductor material, a metal, a metal compound, or a combination thereof. The first conductive structure 103 may include polysilicon, tungsten, a titanium nitride, or a combination thereof. The second conductive structure 104 may be formed perpendicular to the surface of the substrate 101. The second conductive structure 104 may have the shape of a pillar. The second conductive structure 104 may include a semiconductor material, a metal, a metal compound, or a combination thereof. The second conductive structure 104 may include polysilicon, tungsten, a titanium nitride, or a combination thereof. The first conductive structure 103 and the second conductive structure 104 may be formed of the same material or may be formed of different materials. The second conductive structure 104 may be in contact with the pad portion 103P of the first conductive structure 103. The first conductive structure 103 and the second conductive structure 104 may electrically contact each other.

The pad portion 103P of the first conductive structure 103 may include a lower pad 103L, an upper pad 103U, and a pad interconnection portion 103I. The lower pad 103L and the upper pad 103U may be coupled to each other by the pad interconnection portion 103I. The lower pad 103L and the upper pad 103U may be coupled to one end of the base portion 103B at the same time. For example, one end of the base portion 103B may be coupled to the lower pad 103L and the upper pad 103U by the pad interconnection portion 103I. The upper pad 103U may be in direct contact with the second conductive structure 104. A recess 103R may be formed on an upper surface of the upper pad 103U. The bottom surface of the second conductive structure 104 may be positioned in the recess 103R.

The lower pad 103L may be positioned at the same level as the base portion 103B, and the upper pad 103U may be positioned at a higher level than the base portion 103B. The base portion 103B may have a first thickness D1, the lower pad 103L may have a second thickness D2, and the upper pad 103U may have a third thickness D3. The lower pad 103L and the upper pad 103U may have the same thickness (D2=D3). The lower pad 103L may be thicker than the base portion 103B (D2>D1). The total thickness of the lower pad 103L and the upper pad 103U may be thicker than the base 103B. The lengths of the lower pad 103L and the upper pad 103U may be the same. The base portion 103B may be longer than the pad portion 103P.

A buffer pad 105 may be positioned between the lower pad 103L and the upper pad 103U. The buffer pad 105 may include a dielectric material. The buffer pad 105 may be thinner than the lower pad 103L and the upper pad 103U. The buffer pad 105 may be thinner than the base portion 103B.

Referring to FIG. 1, the semiconductor device 100 may be part of a memory device. The semiconductor device 100 may be part of a vertical memory device. The semiconductor device 100 may be part of a vertical NAND flash memory device. For example, the first conductive structure 103 may be a gate electrode, and the second conductive structure 104 may be a contact plug. According to another embodiment, the first conductive structure 103 may be a bit line or a metal line, and the second conductive structure 104 may be a contact plug.

As described above, because the pad portion 103P includes the lower pad 103L and the upper pad 103U, even if the second conductive structure 104 penetrates through the upper pad 103U, the lower pad 103L may be maintained stably. Also, because the upper pad 103U is relatively thicker than the base portion 103B, the punch phenomenon of the second conductive structure 104 may be suppressed. Because the buffer pad 105 is positioned between the lower pad 103L and the upper pad 103U, the lower pad 103L and the upper pad 103U may be protected from collapsing when the second conductive structure 104 is formed. In some embodiments, the buffer pad 105 may be referred to as a support pad.

The pad portion 103P of FIG. 1 is a multi-layered pad structure and may have the form of a double pad including the lower pad 103L and the upper pad 103U.

Figure 2:
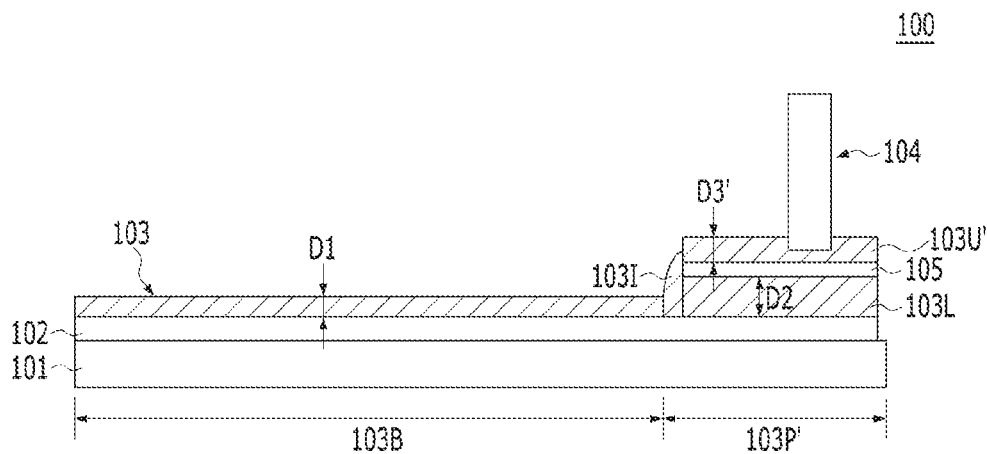
FIG. 2 shows a cross-sectional view illustrating a modified example of a pad portion.

FIG. 2 shows a cross-sectional view illustrating a modified example of the pad portion, indicated at 103P'.

Referring to FIG. 2, the pad portion 103P' may include the lower pad 103L and an upper pad 103U'. The pad portion 103P' may further include the pad interconnection portion 103I coupling the lower pad 103L and the upper pad 103U' to each other. The pad portion 103P' may further include the buffer pad 105 between the lower pad 103L and the upper pad 103U'.

In the pad portion 103P' of FIG. 2, the upper pad 103U' may be thinner than the lower pad 103L (D3'<D2). The upper pad 103U' may be thicker than the base portion 103B (D3'>D1). The total thickness of the lower pad 103L and the upper pad 103U' may be thicker than the base portion 103B.

The pad portion 103P' of FIG. 2 may have the form of a double pad including the lower pad 103L and the upper pad 103U'.

Figure 3A:
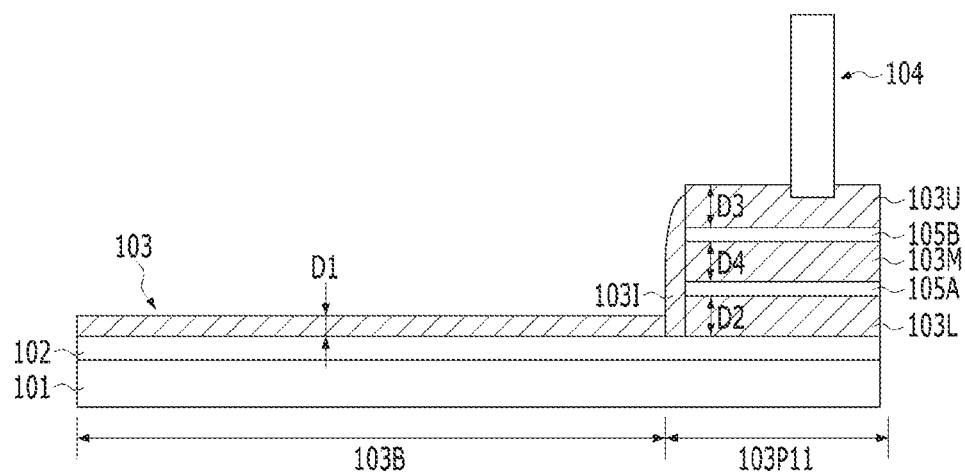
FIGS. 3A to 3C show cross-sectional views illustrating other modified examples of the pad portion.
Figure 3B:
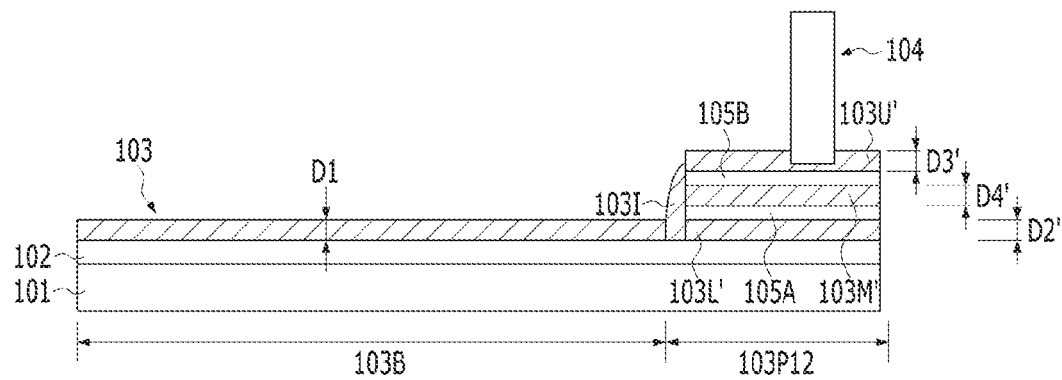
Figure 3C:
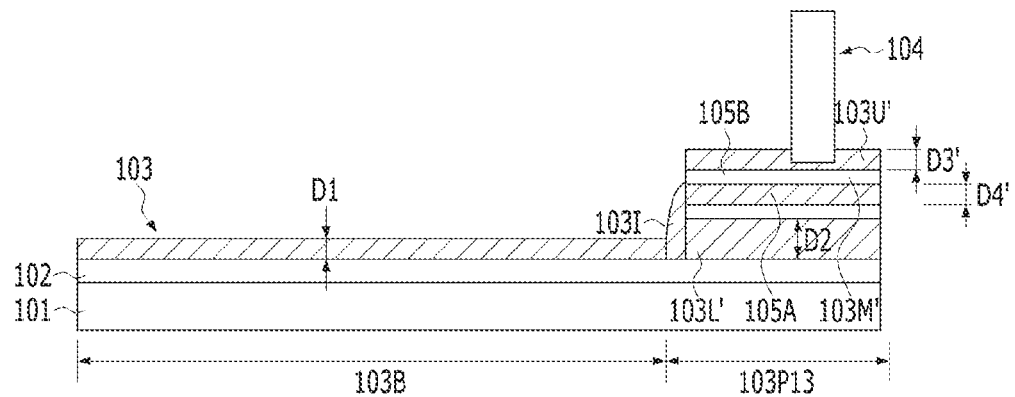

FIGS. 3A to 3C show cross-sectional views illustrating other modified examples of the pad portion consistent with the present teachings.

Referring to FIGS. 3A to 3C, pad portions 103P11, 103P12, and 103P13 may have a multi-layered pad structure, e.g., the pad portions 103P11, 103P12, and 103P13 may have a triple pad shape. The pad portions 103P11, 103P12, and 103P13 may be in contact with the second conductive structure 104.

Referring to FIG. 3A, the pad portion 103P11 may include a lower pad 103L, an upper pad 103U, and a middle pad 103M positioned between the lower pad 103L and the upper pad 103U. The lower pad 103L, the upper pad 103U, and the middle pad 103M may be coupled to each other by a pad interconnection portion 103I. The middle pad 103M may have a thickness D4. The middle pad 103M may have the same thickness as the lower pad 103L and the upper pad 103U (D4=D2=D3). The middle pad 103M may be thicker than the base portion 103B (D4>D1). The middle pad 103M may be made of the same material as the lower pad 103L and the upper pad 103U. A first buffer pad 105A may be positioned between the lower pad 103L and the middle pad 103M. A second buffer pad 105B may be positioned between the upper pad 103U and the middle pad 103M. The first and second buffer pads 105A and 105B may be made of a dielectric material. The first and second buffer pads 105A and 105B may be thinner than the middle pad 103M, the lower pad 103L, and the upper pad 103U.

Referring to FIG. 3B, the pad portion 103P12 may include a lower pad 103L', an upper pad 103U', and a middle pad 103M' positioned between the lower pad 103L' and the upper pad 103U'. The lower pad 103L', the upper pad 103U', and the middle pad 103M' may be coupled to each other by a pad interconnection portion 103I. The middle pad 103M' may have thickness D4'. The middle pad 103M' may have the same thickness as the lower pad 103L' and the upper pad 103U' (D4'=D2'=D3'). The lower pad 103L' and the upper pad 103U' may be as thick as the base portion 103B (D1=D2'=D3'=D4'). The middle pad 103M' may be made of the same material as the lower pad 103L' and the upper pad 103U'. A first buffer pad 105A may be positioned between the lower pad 103L' and the middle pad 103M'. A second buffer pad 105B may be positioned between the upper pad 103U' and the middle pad 103M'. The first and second buffer pads 105A and 105B may be made of a dielectric material. The first and second buffer pads 105A and 105B may be thinner than the middle pad 103M', the lower pad 103L', and the upper pad 103U'.

Referring to FIG. 3C, the pad portion 103P13 may include a lower pad 103L, an upper pad 103U', and a middle pad 103M' positioned between the lower pad 103L and the upper pad 103U'. The lower pad 103L, the upper pad 103U', and the middle pad 103M' may be coupled to each other by a pad interconnection portion 103I. The middle pad 103M' may have a thickness D4'. The middle pad 103M' may be thinner than the lower pad 103L (D4'<D2). The middle pad 103M' and the upper pad 103U' may have the same thickness (D3'=D4'). The middle pad 103M' and the upper pad 103U' may have the same thickness as the base portion 103B (D1=D3'=D4'). The lower pad 103L may be thicker than the base portion 103B (D2>D1). The middle pad 103M' may be made of the same material as the lower pad 103L and the upper pad 103U'. A first buffer pad 105A may be positioned between the lower pad 103L and the middle pad 103M'. A second buffer pad 105B may be positioned between the upper pad 103U' and the middle pad 103M'. The first and second buffer pads 105A and 105B may be made of a dielectric material. The first and second buffer pads 105A and 105B may be thinner than the middle pad 103M', the lower pad 103L, and the upper pad 103U'.

Referring to FIGS. 3A to 3C, each of the pad portions 103P11, 103P12, and 103P13 is formed in a triple pad shape so that a punch margin may be maximized when the second conductive structure 104 is formed.

The pad portions 103P, 103P', 103P11, 103P12, and 103P13, according to the above-described embodiments, may be part of a memory device. The pad portions 103P, 103P', 103P11, 103P12, and 103P13 may be part of a gate electrode. The gate electrode may be part of a word line, a control gate electrode, or a select gate electrode. The word line, the control gate electrode, and the select gate electrode may be part of a non-volatile memory device. The word line, the control gate electrode, and the select gate electrode may be part of a vertical NAND flash memory device.

Figure 4A:
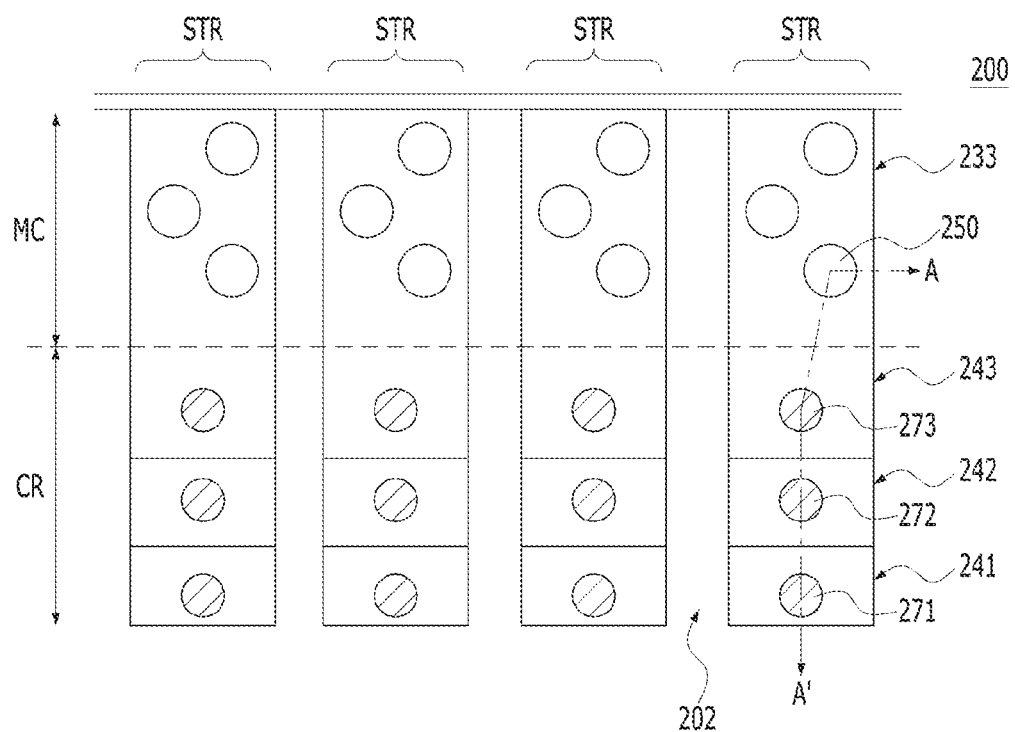
FIGS. 4A and 4B illustrate a vertical memory device.
Figure 4B:
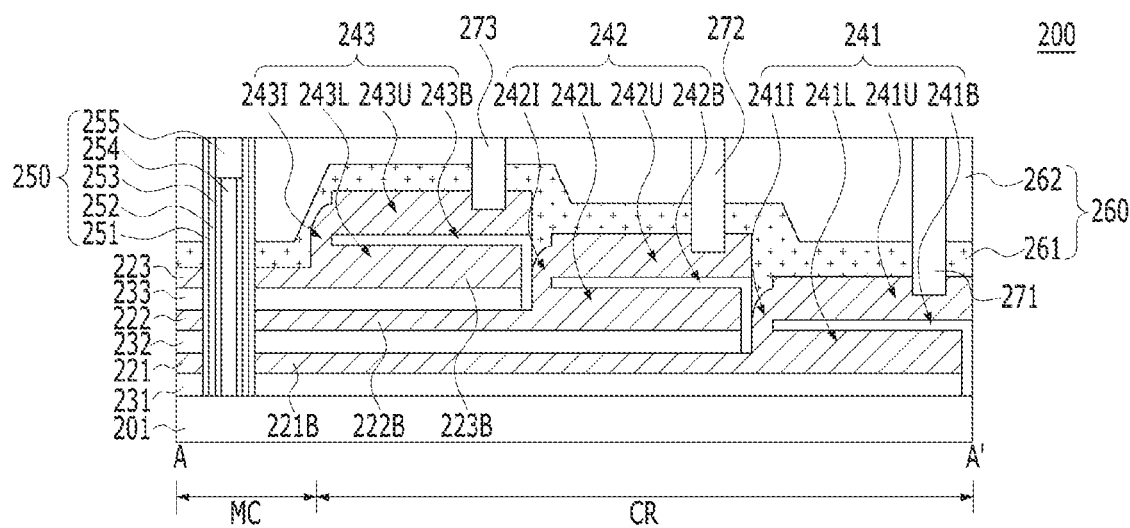

FIGS. 4A and 4B illustrate a vertical memory device 200. FIG. 4A shows a plan view of the vertical memory device 200, and FIG. 4B shows a cross-sectional view of the vertical memory device 200 taken along a line A-A' of FIG. 4A.

Referring to FIGS. 4A and 4B, the vertical memory device 200 may include a plurality of cell strings STR. Each of the cell strings STR may include a cell array region MC and a contact region CR. A plurality of gate electrodes 221, 222, and 223 and a plurality of dielectric layers 231, 232, and 233 may be alternately stacked over an upper surface of the substrate 201. The plurality of gate electrodes 221 to 223 and the plurality of dielectric layers 231 to 233 may be formed over both the cell array region MC and the contact region CR. A plurality of vertical channel structures 250 penetrating through the gate electrodes 221 to 223 and the dielectric layers 231 to 233 may be formed. The plurality of vertical channel structures 250 may be formed in the cell array region MC. Neighboring cell strings STR may be isolated by slits 202. From the perspective of a top view, the vertical channel structures 250 may be regularly arrayed. For convenience of explanation, three vertical channel structures 250 are shown in one cell string STR. In other embodiments, different numbers of the vertical channel structures 250 may be arranged in one cell string STR. For convenience of explanation, three dielectric layers 231 to 233 and three gate electrodes 221 to 223 are shown alternately stacked in FIG. 4B. In other embodiments, different numbers of the dielectric layers 231 to 233 and the gate electrodes 221 to 223 may be alternately stacked. Each of the vertical channel structures 250 may include a charge storage layer 251 which is positioned adjacent to the gate electrodes 221 to 223, a tunnel dielectric layer 252 which is in contact with the charge storage layer 251, and a channel layer 253 which is in contact with the tunnel dielectric layer 252. The inner space of the channel layer 253 may be filled with a core dielectric layer 254. A conductive pad 255 may be formed over the core dielectric layer 254. The tunnel dielectric layer 252 may surround the outer wall of the channel layer 253. The charge storage layer 251 may surround the outer wall of the tunnel dielectric layer 252.

The gate electrodes 221 to 223 may include a conductive material. The gate electrodes 221 to 223 may include titanium nitride, tungsten, or a stack thereof. Each of the gate electrodes 221 to 223 may include base portions 221B, 222B, and 223B and pad portions 241, 242, and 243. The base portions 221B, 222B, and 223B may be positioned over the cell array region MC. A portion of the base portions 221B, 222B, and 223B may extend over the contact region CR. The pad portions 241, 242, and 243 may be positioned over the contact region CR. The pad portions 241, 242, and 243 may extend horizontally from the ends of the base portions 221B, 222B, and 223B. The pad portions 241, 242, and 243 may be thicker than the base portions 221B, 222B, and 223B. The base portions 221B, 222B, and 223B and the pad portions 241, 242, and 243 may include the same material. Each of the base portions 221B, 222B, and 223B may be a single layer, and each of the pad portions 241, 242, and 243 may be multiple layers. Accordingly, the base portions 221B, 222B, and 223B among the gate electrodes 221 to 223 may be referred to as a single-layered gate electrodes, and the pad portions 241, 242, and 243 may be referred to as a multi-layered pad portions.

The gate electrodes 221 to 223 may be referred to as a word line. The dielectric layers 231 to 233 will be referred to as a first dielectric layer 231, a second dielectric layer 232, and a third dielectric layer 233 in a direction perpendicular to the upper surface of the substrate 201. The gate electrodes 221 to 223 are referred to as a first gate electrode 221, a second gate electrode 222, and a third gate electrode 223. The pad portions 241, 242, and 243 may be arranged in a stepwise structure. The pad portions 241, 242, and 243 are referred to as a first pad portion 241, a second pad portion 242, and a third pad portion 243. The upper surface of the first pad portion 241 may be positioned at a lower level than the upper surface of the second pad portion 242, and the upper surface of the second pad portion 242 may be positioned at a lower level than the upper surface of the third pad portion 243. The first pad portion 241 may be coupled to one end of the first gate electrode 221, and the second pad portion 242 may be coupled to one end of the second gate electrode 222. The third pad portion 243 may be coupled to one end of the third gate electrode 223.

A plurality of contact plugs 271, 272, and 273 may be coupled to the pad portions 241, 242, and 243, respectively. For example, the contact plugs 271, 272, and 273 may include a first contact plug 271, a second contact plug 272, and a third contact plug 273. The first contact plug 271 may be coupled to the first pad portion 241, the second contact plug 272 may be coupled to the second pad portion 242, and the third contact plug 273 may be coupled to the third pad portion 243.

The contact plugs 271, 272, and 273 may penetrate through an inter-layer dielectric layer 260. The inter-layer dielectric layer 260 may be formed over the entire profile of the substrate 201 while covering the pad portions 241, 242, and 243. The inter-layer dielectric layer 260 may include a capping layer 261 and a planarization layer 262. The planarization layer 262 may be thicker than the capping layer 261. The vertical channel structure 250 and the contact plugs 271, 272, and 273 may all penetrate through the inter-layer dielectric layer 260.

Referring to FIG. 4B, the pad portions 241, 242, and 243 may respectively include the lower pads 241L, 242L, and 243L, the upper pads 241U, 242U, and 243U, and the pad interconnection portions 241I, 242I, and 243I. The pad interconnection portions 241I, 242I, and 243I may interconnect the lower pads 241L, 242L, and 243L with the upper pads 241U, 242U, and 243U, respectively. The pad portions 241, 242, and 243 may further include buffer pads 241B, 242B, and 243B. The buffer pads 241B, 242B, and 243B may be positioned between the lower pads 241L, 242L, and 243L and the upper pads 241U, 242U, and 243U, respectively. A portion of the buffer pads 241B, 242B, 243B may be in contact with the dielectric layers 231, 232, and 233, respectively. The buffer pads 241B, 242B, and 243B and the capping layer 261 may prevent the neighboring pad portions 241, 242, and 243 from being bridged. The buffer pads 241B, 242B, and 243B may prevent the pad portions 241, 242, and 243 from collapsing by providing structural support. The buffer pads 241B, 242B, and 243B may include a dielectric material. The buffer pads 241B, 242B, and 243B may include silicon oxide. The lower pads 241L, 242L, and 243L, the upper pads 241U, 242U, and 243U, and the pad interconnection portions 241I, 242I, and 243I may include a conductive material. The lower pads 241L, 242L, and 243L, the upper pads 241U, 242U, and 243U, and the pad interconnection portions 241I, 242I, and 243I may include titanium nitride, tungsten, or a stack thereof.

The lower pads 241L, 242L, and 243L and the upper pads 241U, 242U, and 243U may have the same thickness. The lower pads 241L, 242L, and 243L and the upper pads 241U, 242U, and 243U may be thicker than the base portions 221B, 222B, and 223B. The buffer pads 241B, 242B, and 243B may be thinner than the lower pads 241L, 242L, and 243L and the upper pads 241U, 242U, and 243U.

According to another embodiment, the pad portions 241, 242, and 243 may have a structure including a double pad shape and a triple pad shape shown in FIGS. 2 and 3A to 3C.

Figure 5A:
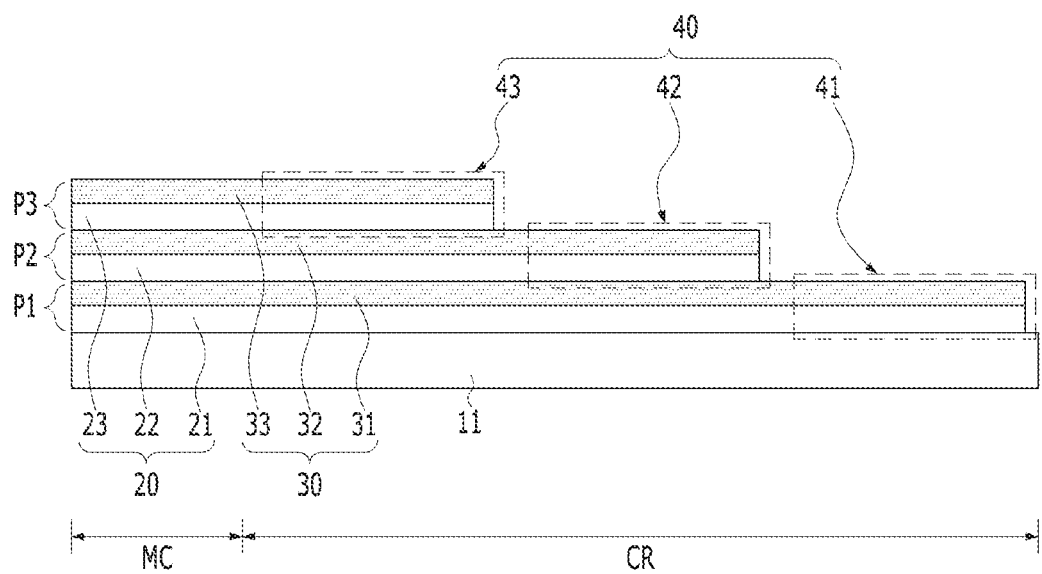
FIGS. 5A to 5P show cross-sectional views describing an example of a method for fabricating a vertical memory device.
Figure 5B:
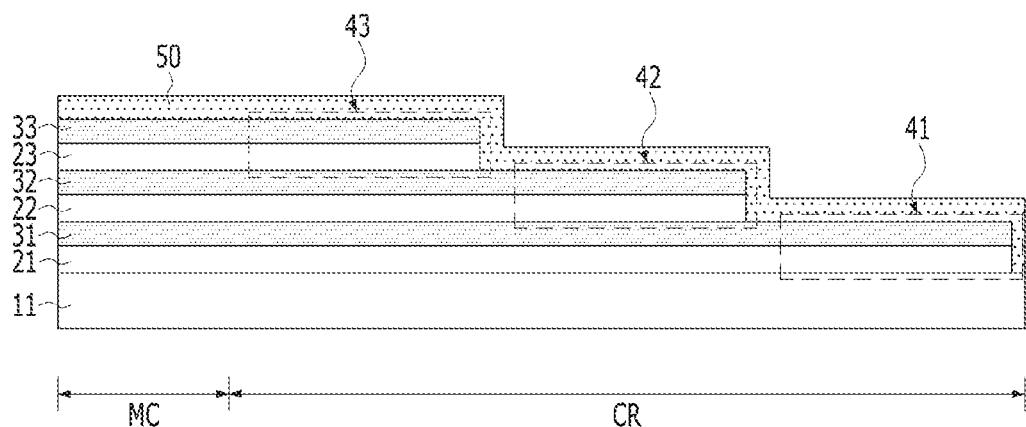
Figure 5C:
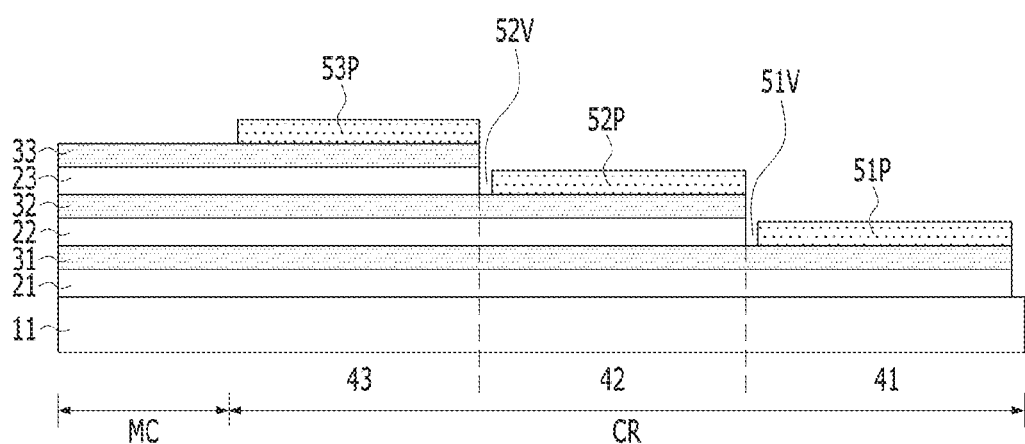
Figure 5D:
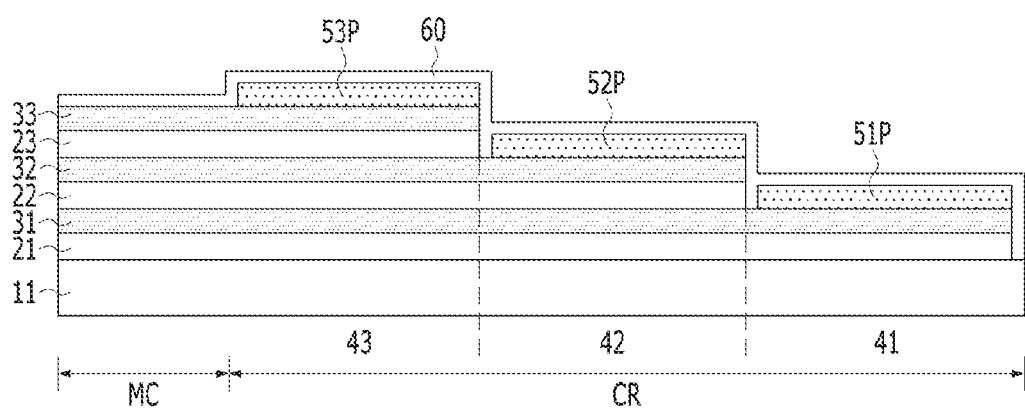
Figure 5E:
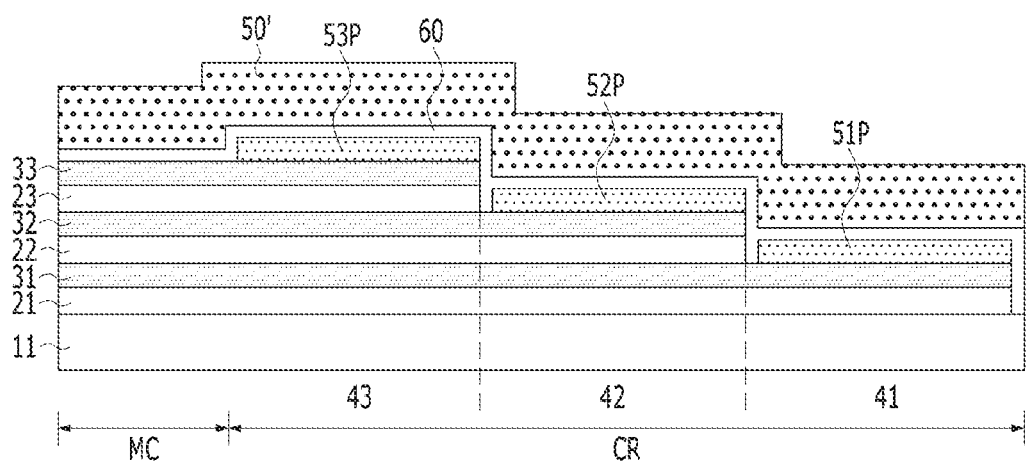
Figure 5F:
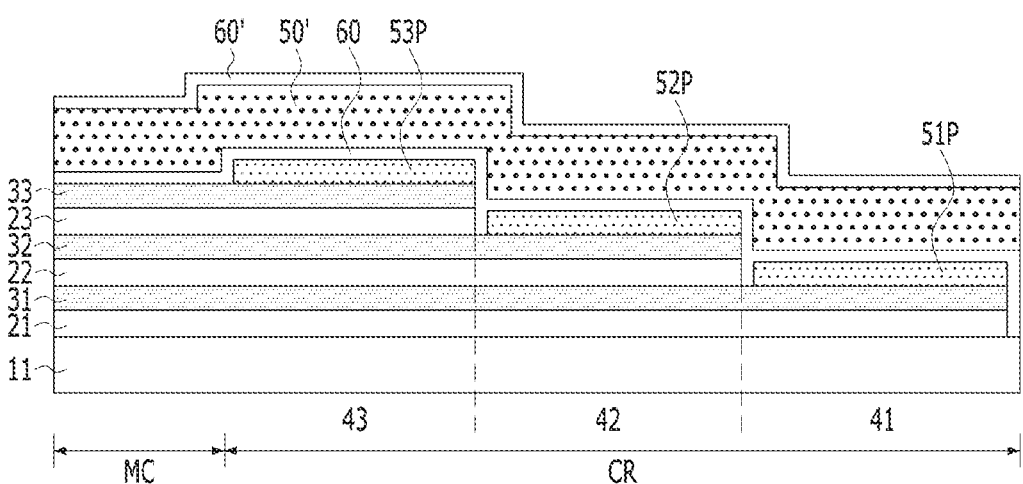
Figure 5G:
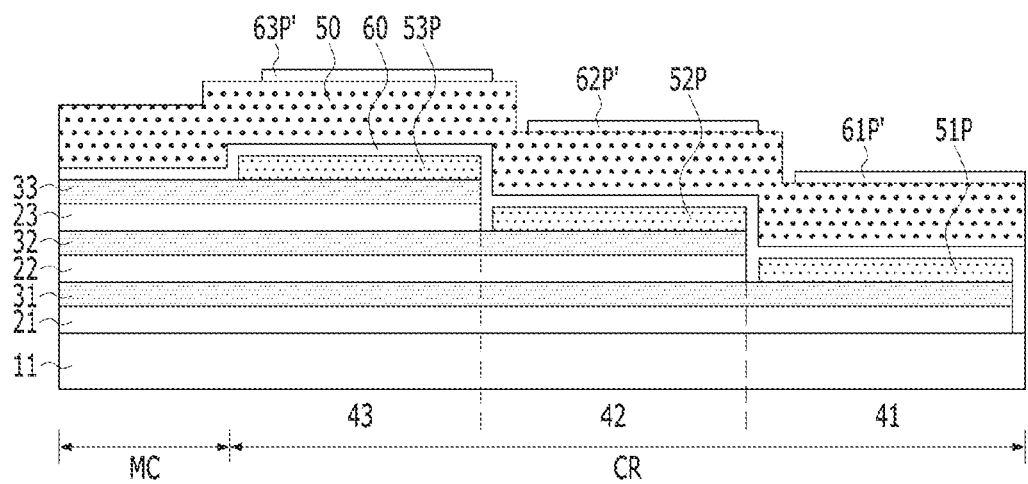
Figure 5H:
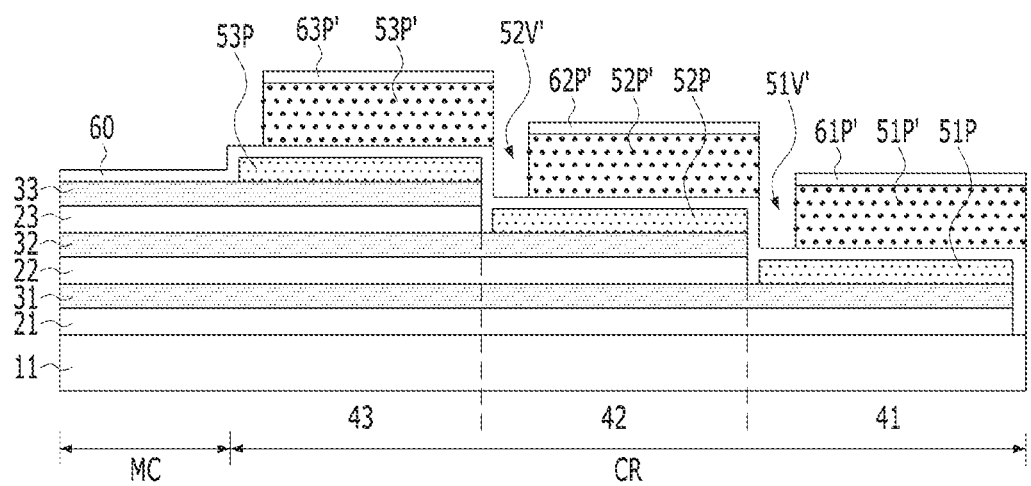
Figure 5I:
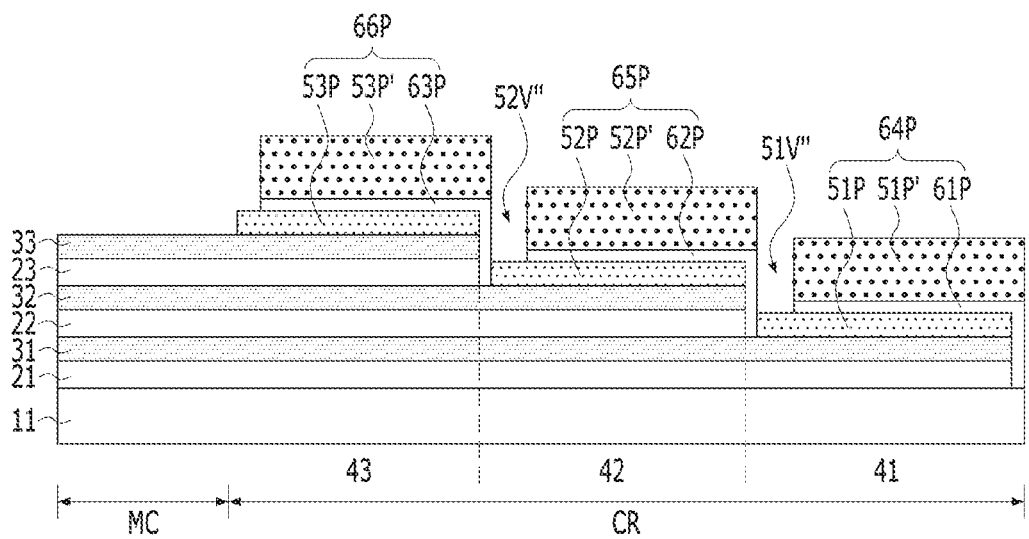
Figure 5J:
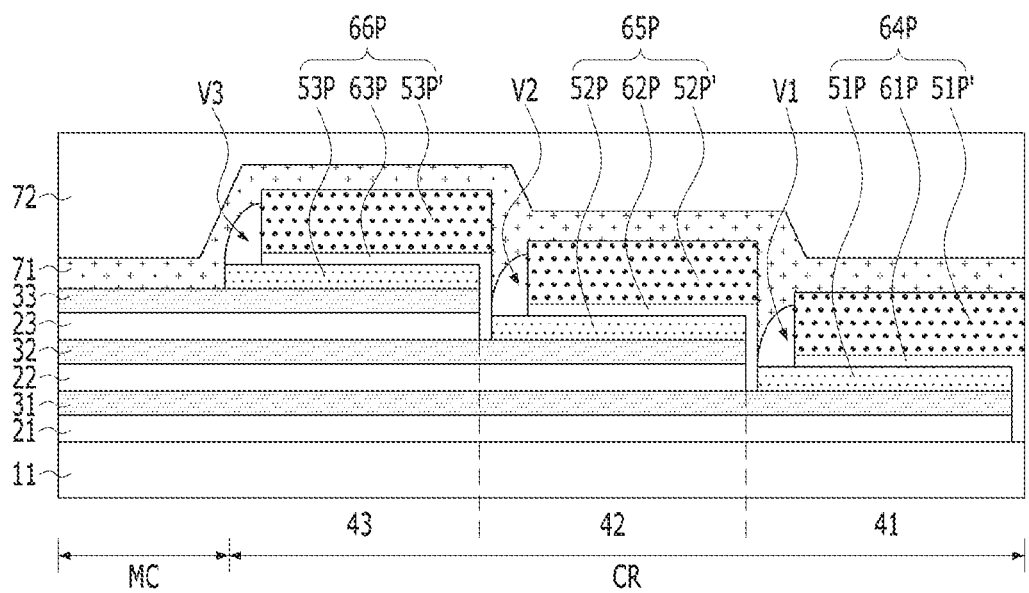
Figure 5K:
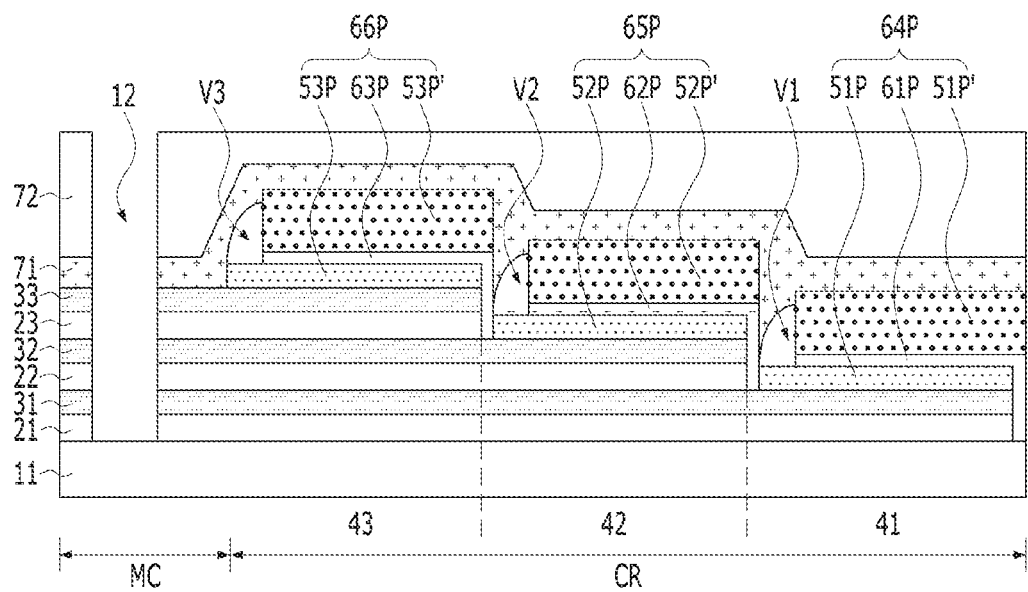
Figure 5L:
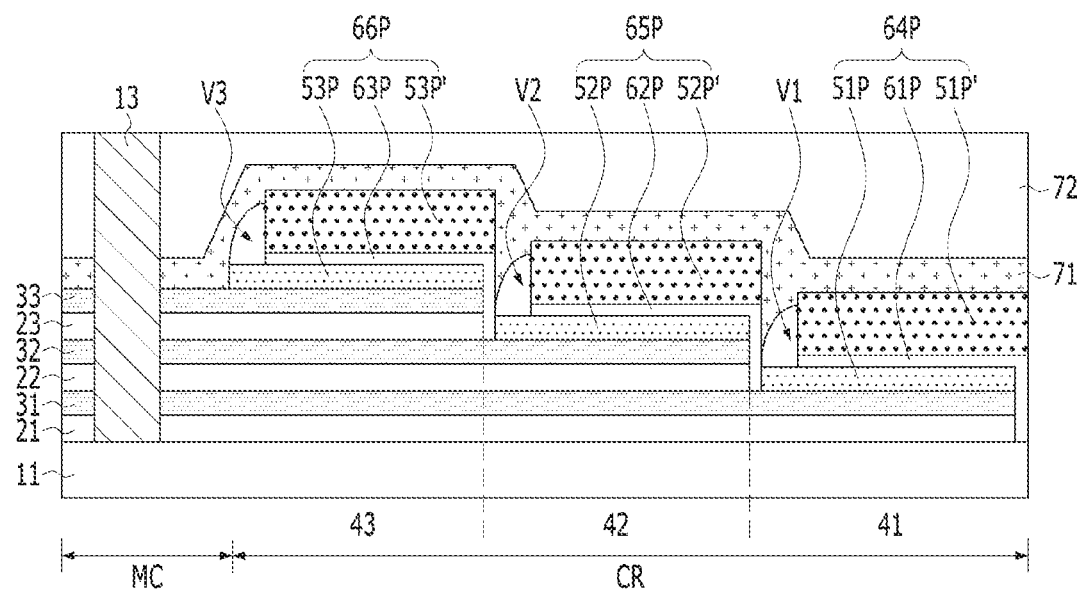
Figure 5M:
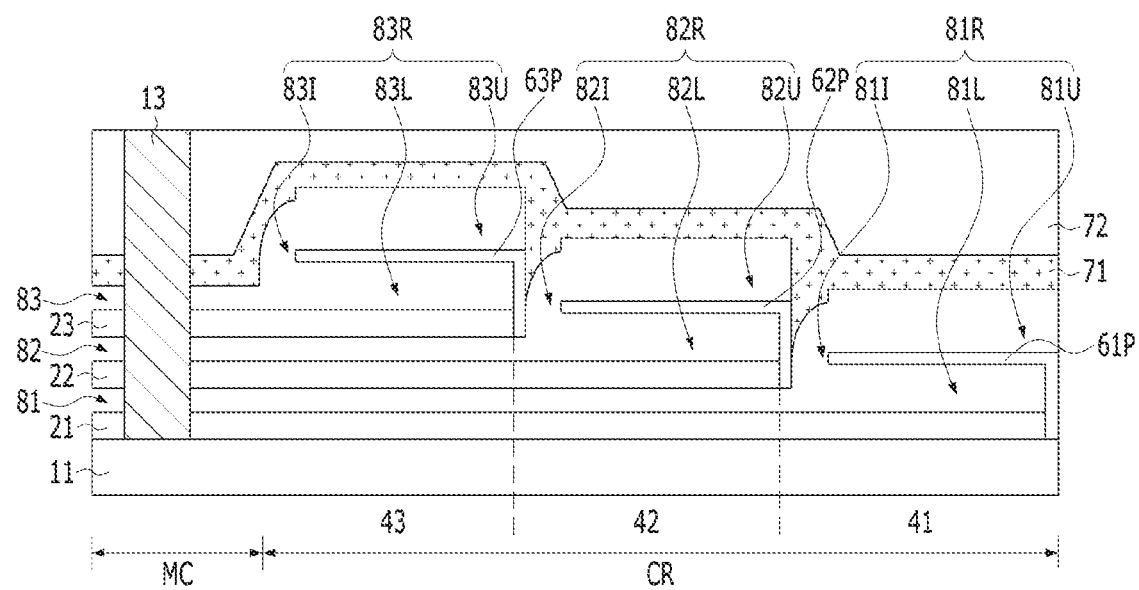
Figure 5N:
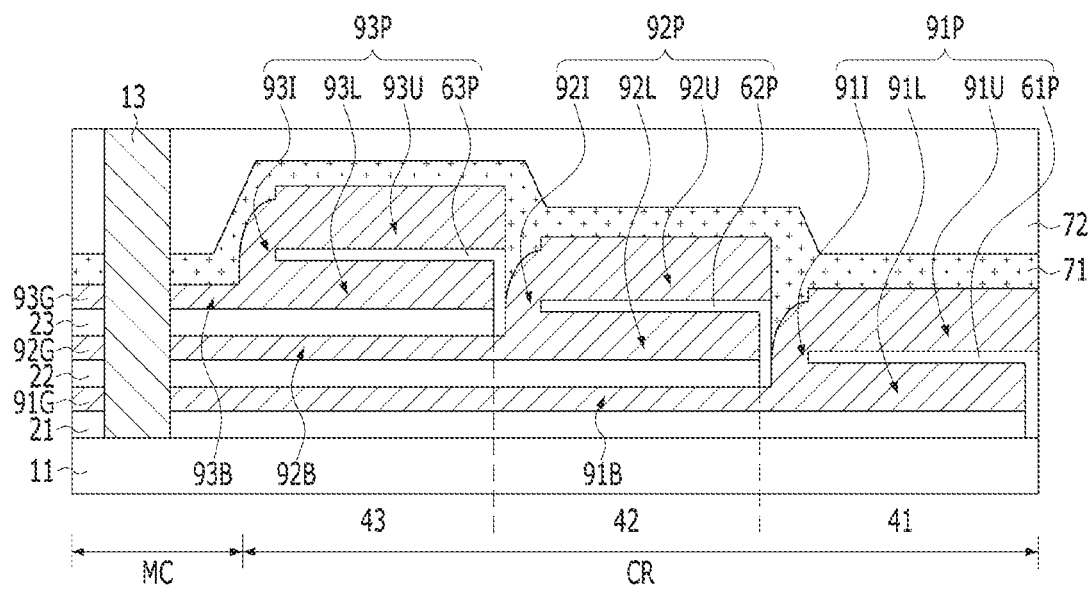
Figure 5O:
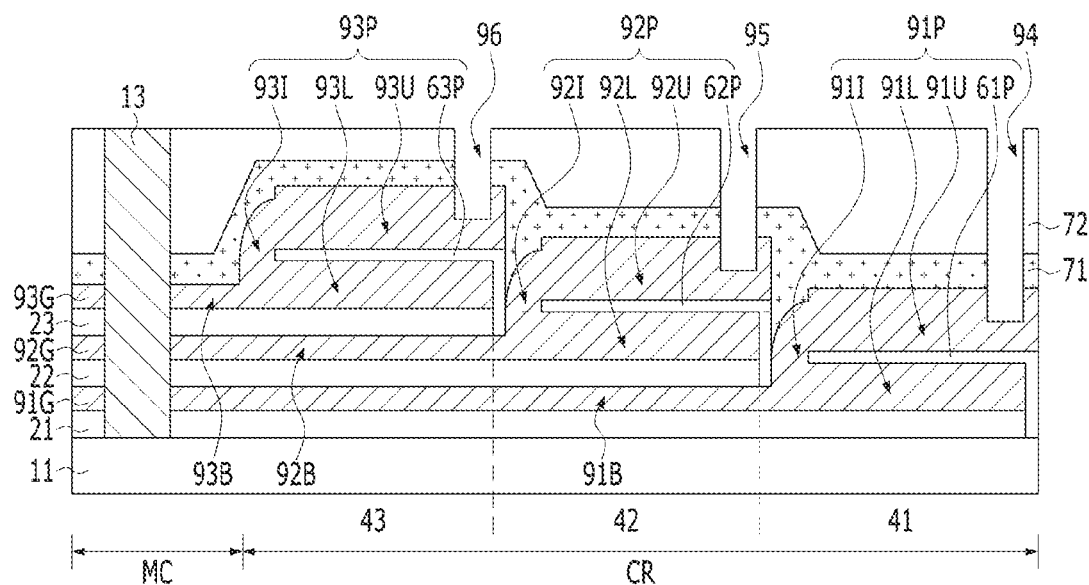
Figure 5P:
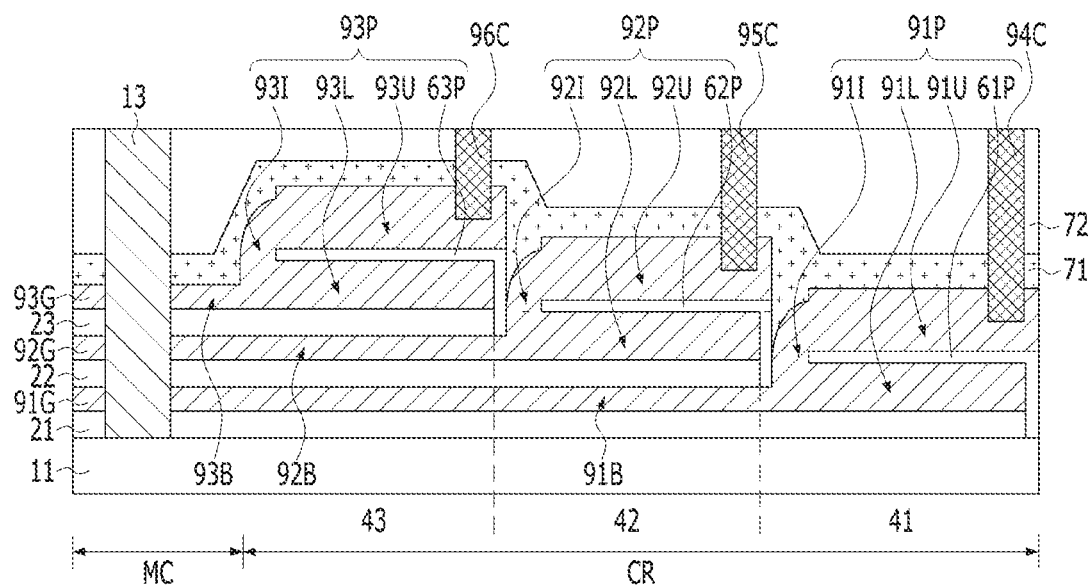

FIGS. 5A to 5P show cross-sectional views used in describing a method for fabricating a vertical memory device.

Referring to FIG. 5A, a dielectric layer stack 20 and a sacrificial layer stack 30 may be formed over a substrate 11. The substrate 11 may include a cell array region MC and a contact region CR. The dielectric layer stack 20 may include a plurality of dielectric layers 21, 22, and 23. The sacrificial layer stack 30 may include a plurality of sacrificial layers 31, 32, and 33. The dielectric layers 21 to 23 and the sacrificial layers 31 to 33 may be alternately stacked. One layer among the dielectric layers 21 to 23 together with one layer among the sacrificial layers 31 to 33 may form a dielectric layer-sacrificial layer pair. For example, a plurality of dielectric layer-sacrificial layer pairs P1, P2, and P3 may be sequentially formed over the substrate 11. Each of the dielectric layer-sacrificial layer pairs P1 to P3 may extend parallel to the surface of the substrate 11. The dielectric layers 21 to 23 and the sacrificial layers 31 to 33 may be alternately stacked in a direction perpendicular to the surface of the substrate 11. The dielectric layer-sacrificial layer pairs P1 to P3 may be of different lengths so that the dielectric layer-sacrificial layer pairs P1 to P3 may form a stepwise structure 40. The stepwise structure 40 may be formed in the contact region CR. A plurality of pad regions 41, 42, and 43 may be defined by the stepwise structure 40. Portions of the sacrificial layers 31 to 33 may be exposed by the stepwise structure 40. For example, as one method for forming the stepwise structure 40, a mask layer (not shown) may be formed after the dielectric layer stack 20 and the sacrificial layer stack 30 are formed, and the sacrificial layer stack 30 and the dielectric layer stack 20 that are exposed through the mask layer may be etched. Subsequently, a process of etching the sacrificial layer stack 30 and the dielectric layer stack 20 exposed through the mask layer while trimming the mask layer may be performed a plurality of times. For example, the dielectric layer-sacrificial layer pair P1 may be formed first, and then the dielectric layer-sacrificial layer pair P3 may be formed later. The sacrificial layers 31 to 33 may be positioned over the dielectric layers 21 to 23, respectively, in each of the dielectric layer-sacrificial layer pairs P1 to P3. The pad regions 41 to 43 may include a first pad region 41, a second pad region 42, and a third pad region 43.

The dielectric layers 21 to 23 and the sacrificial layers 31 to 33 may be formed of a material having an etch selectivity. The etch selectivity may be defined as the ratio of the etch rate of the sacrificial layers 31 to 33 to the etch rate of the dielectric layers 21 to 23. The dielectric layers 21 to 23 may be of a material that is not removed when the sacrificial layers 31 to 33 are etched. The dielectric layers 21 to 23 may be formed of silicon oxide, and the sacrificial layers 31 to 33 may be formed of a material having an etch selectivity to the dielectric layers 21 to 23. For example, the dielectric layers 21 to 23 may be silicon oxide, and the sacrificial layers 31 to 33 may be silicon nitride. According to another embodiment, the sacrificial layers 31 to 33 may include a silicon layer or silicon carbide.

Referring to FIG. 5B, a sacrificial pad layer 50 may be formed. The sacrificial pad layer 50 may be formed over the entire profile of the substrate 11, including the stepwise structure 40. The sacrificial pad layer 50 may cover the pad regions 41, 42, and 43. The sacrificial pad layer 50 and the sacrificial layers 31, 32, and 33 may be formed of the same material. The sacrificial pad layer 50 and the dielectric layers 21, 22, and 23 may be formed of different materials. The sacrificial pad layer 50 may be formed of a material having an etch selectivity with respect to the dielectric layers 21 to 23. The sacrificial pad layer 50 may include silicon nitride, and the dielectric layers 21 to 23 may include silicon oxide.

Referring to FIG. 5C, a plurality of sacrificial pads 51P, 52P, and 53P may be formed. The sacrificial pads 51P to 53P may be formed in the pad regions 41, 42, and 43, respectively. The sacrificial pad layer 50 may be etched to form the sacrificial pads 51P to 53P. The sacrificial pads 51P to 53P might not contact the dielectric layers 21 to 23. The sacrificial pads 51P to 53P may include a first sacrificial pad 51P, a second sacrificial pad 52P, and a third sacrificial pad 53P. The first sacrificial pad 51P may be formed in the first pad region 41, the second sacrificial pad 52P may be formed in the second pad region 42, and the third sacrificial pad 53P may be formed in the third pad region 43. The first sacrificial pad 51P, the second sacrificial pad 52P, and the third sacrificial pad 53P may have the same thickness. The first sacrificial pad 51P, the second sacrificial pad 52P, and the third sacrificial pad 53P may have the same length. The first sacrificial pad 51P and the second dielectric layer 22 may be positioned at the same level. A first gap 51V may be formed between the first sacrificial pad 51P and the second dielectric layer 22. The second sacrificial pad 52P and the third dielectric layer 23 may be positioned at the same level. A second gap 52V may be formed between the second sacrificial pad 52P and the third dielectric layer 23. The first sacrificial pad 51P and the second sacrificial pad 52P may be spaced apart from each other by the first gap 51V. The second sacrificial pad 52P and the third sacrificial pad 53P may be spaced apart from each other by the second gap 52V.

Referring to FIG. 5D, a buffer layer 60 may be formed. The buffer layer 60 may be formed over the entire profile of the substrate 11, including the sacrificial pads 51P to 53P. The buffer layer 60 may cover a plurality of sacrificial pads 51P to 53P. The buffer layer 60 may fill the first gap 51V and the second gap 52V. The buffer layer 60 and the dielectric layers 21 to 23 may be formed of the same material. The buffer layer 60 and the sacrificial layers 31 to 33 may be formed of different materials. The buffer layer 60 may be formed of a material having an etch selectivity with respect to the sacrificial layers 31 to 33 and the sacrificial pads 51P to 53P. The buffer layer 60 may include silicon oxide. A portion of the buffer layer 60 may cover the side walls of the sacrificial layers 31 to 33. The first sacrificial pad 51P and the second sacrificial pad 52P may be spaced apart from each other by the buffer layer 60. The second sacrificial pad 52P and the third sacrificial pad 53P may be spaced apart from each other by the buffer layer 60.

Referring to FIG. 5E, an additional sacrificial pad layer 50' may be formed. The additional sacrificial pad layer 50' may be formed over the entire profile of the substrate 11, including the buffer layer 60. The additional sacrificial pad layer 50' may cover the pad regions 41 to 43. The additional sacrificial pad layer 50' and the sacrificial layers 31 to 33 may be formed of the same material. The additional sacrificial pad layer 50' and the sacrificial pads 51P to 53P may be formed of the same material. The additional sacrificial pad layer 50' and the dielectric layer 21 to 23 may be formed of different materials. The additional sacrificial pad layer 50' and the buffer layer 60 may be formed of different materials. The additional sacrificial pad layer 50' may be formed of a material having an etch selectivity with respect to the dielectric layer 21 to 23 and the buffer layer 60. The additional sacrificial pad layer 50' may include silicon nitride, and the dielectric layers 21 to 23 and the buffer layer 60 may include silicon oxide. The additional sacrificial pad layer 50' may be thicker than the sacrificial pads 51P to 53P. The additional sacrificial pad layer 50' may be formed to a thickness of approximately 400 Å. In various embodiments, for example, additional sacrificial pad layer 50' may be formed to a thickness of between 300 Å and 500 Å. The thickness of the additional sacrificial pad layer 50' may be the same as the total thickness of one sacrificial layer among the sacrificial layers 31 to 33 and the sacrificial pad layer 50. The additional sacrificial pad layer 50' and the sacrificial pads 51P to 53P may be spaced apart from each other by the buffer layer 60.

Referring to FIG. 5F, a sacrificial buffer layer 60' may be formed. The sacrificial buffer layer 60' may be formed over the entire profile of the substrate 11, including the additional sacrificial pad layer 50'. The sacrificial buffer layer 60' and the buffer layer 60 may be formed of the same material. The sacrificial buffer layer 60' and the additional sacrificial pad layer 50' may be formed of different materials. The sacrificial buffer layer 60' may be formed of a material having an etch selectivity with respect to the additional sacrificial pad layer 50'. The sacrificial buffer layer 60' may include silicon oxide, and the additional sacrificial pad layer 50' may include silicon nitride. The sacrificial buffer layer 60' may be thinner than the additional sacrificial pad layer 50'. The sacrificial buffer layer 60' and the buffer layer 60 may have the same thickness.

Referring to FIG. 5G, sacrificial buffer pads 61P', 62P', and 63P' may be formed. The sacrificial buffer pads 61P' to 63P' may be formed in the pad regions 41 to 43. In order to form the sacrificial buffer pads 61P' to 63P', the sacrificial buffer layer 60' may be etched by using a mask pattern (not shown). The sacrificial buffer layer 60' may be wet-etched to form the sacrificial buffer pads 61P' to 63P'. Portions of the additional sacrificial pad layer 50' may be exposed as the sacrificial buffer pads 61P' to 63P' are formed.

Referring to FIG. 5H, a plurality of additional sacrificial pads 51P', 52P', and 53P' may be formed. The additional sacrificial pad layer 50' may be etched by using the sacrificial buffer pads 61P' to 63P' as an etch mask to form the plurality of additional sacrificial pads 51P' to 53P'. The additional sacrificial pad layer 50' may be wet-etched to form the additional sacrificial pads 51P' to 53P'. The plurality of additional sacrificial pads 51P' to 53P' may be formed in the pad regions 41 to 43. After forming the additional sacrificial pads 51P' to 53P', portions of the buffer layer 60 may be exposed. The additional sacrificial pads 51P' to 53P' may include a first additional sacrificial pad 51P', a second additional sacrificial pad 52P', and a third additional sacrificial pad 53P'.

A first pad gap 51V' may be formed between the first additional sacrificial pad 51P' and the second additional sacrificial pad 52P'. A second pad gap 52V' may be formed between the second additional sacrificial pad 52P' and the third additional sacrificial pad 53P'. The first additional sacrificial pad 51P' and the second additional sacrificial pad 52P' may be spaced apart from each other by the first pad gap 51V'. The second additional sacrificial pad 52P' and the third additional sacrificial pad 53P' may be spaced apart from each other by the second pad gap 52V'. The upper surface of the first additional sacrificial pad 51P' may be positioned at a level lower than the upper surface of the second additional sacrificial pad 52P'. The upper surface of the second additional sacrificial pad 52P' may be positioned at a level lower than the upper surface of the third additional sacrificial pad 53P'.

Referring to FIG. 5I, buffer pads 61P, 62P, and 63P may be formed. In order to form the buffer pads 61P to 63P, the buffer layer 60 may be etched by using the additional sacrificial pads 51P' to 53P' as an etching mask. The buffer layer 60 may be dry-etched to form the buffer pads 61P to 63P. When the buffer layer 60 is etched, the sacrificial buffer pads 61P' to 63P' may be removed. After the buffer pads 61P to 63P are formed, a portion of the sacrificial pads 51P, 52P, and 53P may be exposed. The buffer pads 61P to 63P may include a first buffer pad 61P, a second buffer pad 62P, and a third buffer pad 63P. A first pad gap 51V'' may be formed between the first buffer pad 61P and the second buffer pad 62P, and a second pad gap 52V'' may be formed between the second buffer pad 62P and the third buffer pad 63P. The first buffer pad 61P and the second buffer pad 62P may be spaced apart from each other by the first pad gap 51V''. The second buffer pad 62P and the third buffer pad 63P may be spaced apart from each other by the second pad gap 52V''. The upper surface of the first buffer pad 61P may be positioned at a level lower than the upper surface of the second buffer pad 62P. The upper surface of the second buffer pad 62P may be positioned at a level lower than the upper surface of the third buffer pad 63P. The first pad gap 51V'' and the second pad gap 52V'' may extend down beyond the bottom of the first pad gap 51V' and the second pad gap 52V', respectively, through the buffer layer 60.

As described above, by forming the buffer pads 61P to 63P, a plurality of protruding structures 64P, 65P, and 66P may be formed in the contact region CR. The protruding structures 64P, 65P, and 66P may be formed as a stepwise structure. The protruding structures 64P, 65P, and 66P may be stacked over the sacrificial layers 31 to 33, respectively, in the order of the sacrificial pads 51P to 53P, the buffer pads 61P to 63P, and the additional sacrificial pads 51P' to 53P'. Each of the protruding structures 64P, 65P, and 66P may be referred to as a multi-layered sacrificial structure. In other words, each of the protruding structures 64P, 65P, 66P may include the sacrificial layers 31 to 33, the sacrificial pads 51P to 53P, and the additional sacrificial pads 51P' to 53P', respectively. Each of the sacrificial layers 31 to 33 formed in the cell array region MC may have a single-layer structure. For an embodiment, the sacrificial layers 51P to 53P and the additional sacrificial layers 51P' to 53P' are not formed in the cell array region MC, and only the sacrificial layers 31 to 33 are be formed in the cell array region MC.

As shown in FIG. 5J, a capping layer 71 may be formed. A planarization layer 72 may be formed over the capping layer 71. The capping layer 71 may be formed over the entire profile of the substrate 11, including the additional sacrificial pads 51P' to 53P'. The capping layer 71 may cover the additional sacrificial pads 51P' to 53P'. When the capping layer 71 is formed, air gaps V1, V2, and V3 may be formed over the sacrificial pads 51P, 52P, and 53P and adjacent to the additional sacrificial pads 51P', 52P', and 53P', respectively. In order to form the air gaps V1 to V3, the capping layer 71 may be formed non-conformally. For example, the capping layer 71 may have poor step coverage to form the air gaps V1 to V3. The capping layer 71 may be formed using a plasma-based deposition method, such as Plasma Enhanced Chemical Vapor Deposition (PECVD) or Plasma Enhanced Atomic Layer Deposition (PEALD). The capping layer 71 and the planarization layer 72 may be collectively referred to as an inter-layer dielectric layer. The capping layer 71 may include silicon oxide. For example, the capping layer 71 may include Undoped Silicate Glass (USG).

The air gaps V1 to V3 may include a first air gap V1, a second air gap V2, and a third air gap V2. The first air gap V1 may be positioned on the side wall of the first buffer pad 61P. The second air gap V2 may be positioned on the side wall of the second buffer pad 62P. The third air gap V3 may be positioned on the side wall of the third buffer pad 63P. The first air gap V1 may interconnect the first sacrificial pad 51P and the first additional sacrificial pad 51P'. The second air gap V2 may interconnect the second sacrificial pad 52P and the second additional sacrificial pad 52P'. The third air gap V3 may interconnect the third sacrificial pad 53P and the third additional sacrificial pad 53P'.

Referring to FIG. 5K, a vertical hole 12 may be formed. The vertical hole 12 may be formed perpendicular to the surface of the substrate 11. The vertical hole 12 may be formed by etching the dielectric layers 21 to 23, the sacrificial layers 31 to 33, the capping layer 71, and the planarization layer 72. The vertical hole 12 may be formed in the cell array region MC. Although not illustrated, the vertical hole 12 may be formed in plural, and the plurality of such holes may have an array structure from the perspective of a plan view. When the vertical holes 12 are formed, the surface of the substrate 11 may be over-etched.

Referring to FIG. 5L, a vertical channel structure 13 may be formed. The vertical channel structure 13 may fill the vertical holes 12. The vertical channel structure 13 may correspond to the vertical channel structure 250 of FIG. 4B. The vertical channel structure 13 may be referred to as 'a pillar structure.'

Subsequently, referring to FIGS. 5M and 5N, a process of replacing the sacrificial layers 31 to 33 and the protruding structures 64P, 65P, and 66P with gate electrodes 91G, 92G, and 93G and pad portions 91P, 92P, and 93P may be performed.

Referring to FIG. 5M, a plurality of recesses 81, 82, and 83 may be formed. In order to form the recesses 81 to 83, a slit (see 202 in FIG. 4A) may be formed first. The sacrificial layers 31 to 33 may be removed through the slit, and the recesses 81 to 83 may be formed between the dielectric layers 21 to 23. The sacrificial layers 31 to 33 may be removed through a wet etch process. For example, when the sacrificial layers 31 to 33 include silicon nitride, the sacrificial layers 31 to 33 may be removed through a wet etching process using a phosphoric acid ($H_3PO_4$) solution. The recesses 81 to 83 may be parallel to the surface of the substrate 11. The recesses 81 to 83 may be referred to as horizontal recesses. The recesses 81 to 83 may expose the sidewalls of the vertical channel structure 13.

The recesses 81 to 83 may include a first recess 81, a second recess 82, and a third recess 83. Each of the first recess 81, the second recess 82, and the third recess 83 may have a first stack-type recess 81R, a second stack-type recess 82R, and a third stack-type recess 83R that are positioned in the contact region CR. The sacrificial layers 31 to 33, the sacrificial pads 51P to 53P, and the additional sacrificial pads 51P' to 53P' may be removed in order to form the first stack-type recess 81R, the second stack-type recess 82R, and the third stack-type recess 83R. The first stack-type recess 81R may include a stack of a first lower recess 81L and a first upper recess 81U, and may further include a first interconnection recess 81I interconnecting the first lower recess 81L and the first upper recess 81U. The second stack-type recess 82R may include a stack of a second lower recess 82L and a second upper recess 82U, and may further include a second interconnection recess 82I interconnecting the second lower recess 82L and the second upper recess 82U. The third stack-type recess 83R may include a stack of a third lower recess 83L and a third upper recess 83U, and may further include a third interconnection recess 83I interconnecting the third lower recess 83L and the third upper recess 83U. The first to third interconnection recesses 81I to 83I may correspond to the first to third air gaps V1 to V3. Therefore, the air gaps V1 to V3 may be embedded in the inside of the first stack-type recess 81R, the second stack-type recess 82R, and the third stack-type recess 83R, respectively.

The first buffer pad 61P may be positioned between the first lower recess 81L and the first upper recess 81U. The second buffer pad 62P may be positioned between the second lower recess 82L and the second upper recess 82U. The third buffer pad 63P may be positioned between the third lower recess 83L and the third upper recess 83U. The first buffer pad 61P may be coupled to the first dielectric layer 21, the second buffer pad 62P may be coupled to the second dielectric layer 22, and the third buffer pad 63P may be coupled to the second dielectric layer 23.

For an embodiment, the first stack-type recess 81R, the second stack-type recess 82R, and the third stack-type recess 83R do not contact each other due to the dielectric layers 21 to 23, the capping layer 71, and the first to third buffer pads 61P to 63P.

As described above, the stack-type recesses 81R, 82R, and 83R may be formed in the contact region CR. The recesses 81, 82, and 83 formed in the cell array region MC may be single-type recesses. The stacking recesses 81R, 82R, and 83R may be thicker than the recesses 81, 82, and 83 formed in the cell array region MC. The stack-type recesses 81R, 82R, and 83R may be thick recesses, and the recesses 81, 82, and 83 formed in the cell array region MC may be relatively thin recesses.

Referring to FIG. 5N, a plurality of gate electrodes 91G, 92G, and 93G may be formed. The gate electrodes 91G to 93G may be formed by filling the recesses 81, 82, and 83, the air gaps V1 to V3, and the stack-type recesses 81R, 82R, and 83R with a conductive material. This may be referred to as 'an inner filling process'. The gate electrodes 91G to 93G may include tungsten. According to an embodiment, the gate electrodes 91G to 93G may be a stack of titanium nitride/tungsten (TiN/W). The gate electrodes 91G to 93G may surround the vertical channel structure 13.

The gate electrodes 91G to 93G may include a first gate electrode 91G, a second gate electrode 92G, and a third gate electrode 93G. The first gate electrode 91G, the second gate electrode 92G, and the third gate electrode 93G may be vertically stacked with the dielectric layers 21 to 23 interposed between them.

The first gate electrode 91G may include a first base portion 91B and a first pad portion 91P. The second gate electrode 92G may include a second base portion 92B and a second pad portion 92P. The third gate electrode 93G may include a third base portion 93B and a third pad portion 93P. The first pad portion 91P may extend from the end of the first base portion 91B. The second pad portion 92P may extend from the end of the second base portion 92B. The third pad portion 93P may extend from the end of the third base portion 93B. The first pad portion 91P, the second pad portion 92P, and the third pad portion 93P may be positioned in the contact region CR. The first base portion 91B, the second base portion 92B, and the third base portion 93B may have the same thickness. The first pad portion 91P, the second pad portion 92P, and the third pad portion 93P may have the same thickness. The first pad portion 91P, the second pad portion 92P, and the third pad portion 93P may be thicker than the first base portion 91B, the second base portion 92B, and the third base portion 93B, respectively. Each of the first base portion 91B, the second base portion 92B, and the third base portion 93B may be referred to as a single-layered gate electrode. Each of the first pad portion 91P, the second pad portion 92P, and the third pad portion 93P may be referred to as a multi-layered pad portion.

Each of the first pad portion 91P, the second pad portion 92P, and the third pad portion 93P may have a double pad structure. The first pad portion 91P may include a first lower pad 91L, a first upper pad 91U, and a first pad interconnection portion 91I interconnecting the first lower pad 91L and the first upper pad 91U. The second pad portion 92P may include a second lower pad 92L, a second upper pad 92U, and a second pad interconnection portion 92I interconnecting the second lower pad 92L and the second upper pad 92U. The third pad portion 93P may include a third lower pad 93L, a third upper pad 93U, and a third pad interconnection portion 93I interconnecting the third lower pad 93L and the third upper pad 93U. The first upper pad 91U, the second upper pad 92U, and the third upper pad 93U may be spaced apart from each other by the capping layer 71. The first lower pad 91L and the first upper pad 91U may have the same thickness, and may be thicker than the first base portion 91B. The second lower pad 92L and the second upper pad portion 92U may have the same thickness and may be thicker than the second base portion 92B. The third lower pad 93L and the third upper pad 93U may have the same thickness and may be thicker than the third base portion 93B. The first lower pad 91L, the second lower pad 92L, and the third lower pad 93L may have the same thickness. The first upper pad 91U, the second upper pad 92U, and the third upper pad 93U may have the same thickness.

The first pad portion 91P, the second pad portion 92P, and the third pad portion 93P may further include a first buffer pad 61P, a second buffer pad 62P, and a third buffer pad 63P, respectively. The first buffer pad 61P may be positioned between the first lower pad 91L and the first upper pad 91U. The second buffer pad 62P may be positioned between the second lower pad 92L and the second upper pad 92U. The third buffer pad 63P may be positioned between the third lower pad 93L and the third upper pad 93U. The first buffer pad 61P, the second buffer pad 62P, and the third buffer pad 63P may be in contact with the first dielectric layer 21, the second dielectric layer 22, and the third dielectric layer 23, respectively.

The first pad portion 91P, the second pad portion 92P, and the third pad portion 93P may have a stepwise structure. The upper surface of the first pad portion 91P may be positioned at a level lower than the upper surface of the second pad portion 92P, and the upper surface of the second pad portion 92P may be positioned at a level lower than the upper surface of the third pad portion 93P.

Referring to FIG. 5O, a plurality of contact holes 94, 95, and 96 may be formed. The contact holes 94, 95, and 96 may be formed by using a contact mask (not shown) and etching the planarization layer 72 and the capping layer 71. For example, the contact holes 94, 95, and 96 may include a first contact hole 94, a second contact hole 95, and a third contact hole 96. The first contact hole 94 may expose the first upper pad 91U, the second contact hole 95 may expose the second upper pad 92U, and the third contact hole 96 may expose the third upper pad 93U. The depths of the first contact hole 94, the second contact hole 95, and the third contact hole 96 may be different from each other.

When the first contact hole 94, the second contact hole 95, and the third contact hole 96 are formed, the first buffer pad 61P, the second buffer pad 62P, and the third buffer pad 63P may serve as a supporting layer. The first buffer pad 61P, the second buffer pad 62P, and the third buffer pad 63P may increase the structural stability of the first pad portion 91P, the second pad portion 92P, and the third pad portion 93P. Also, when the first contact hole 94, the second contact hole 95, and the third contact hole 96 are formed, the first buffer pad 61P, the second buffer pad 62P, and the third buffer pad 63P may serve as etch stop layers. The first buffer pad 61P, the second buffer pad 62P, and the third buffer pad 63P may suppress the punch phenomenon of the first pad portion 91P, the second pad portion 92P, and the third pad portion 93P.

According to some embodiments, when the contact holes 94, 95, and 96 are formed, punching may be stopped over the lower pads 91L, 92L, and 93L even when the upper pads 91U, 92U, and 93U are punched. Thus, bridges between the vertically stacked gate electrodes 91G, 92G, and 93G may be prevented.

Referring to FIG. 5P, a plurality of contact plugs 94C, 95C, and 96C may be formed. The contact plugs 94C, 95C, and 96C may be formed by filling the contact holes 94, 95, and 96 with a conductive material such as a metal layer and then performing a planarization process. The contact plugs 94C, 95C, and 96C may include a first contact plug 94C, a second contact plug 95C, and a third contact plug 96C. The first contact plug 94C may fill the first contact hole 94, the second contact plug 95C may fill the second contact hole 95, and the third contact plug 96C may fill the third contact hole 96. The first contact plug 94C may be in contact with the first upper pad 91U, the second contact plug 95C may be in contact with the second upper pad 92U, and the third contact plug 96C may be in contact with the third upper pad 93U. The first contact plug 94C, the second contact plug 95C, and the third contact plug 96C may have different heights.

Because the pad portions 91P, 92P, and 93P are formed in the double pad structure, the contact plugs 94C, 95C, and 96C are prevented from being punched. As a result, short-circuit failure of the gate electrodes 91G, 92G, and 93G is avoided.

Also, because the gate electrodes 91G, 92G, and 93G are thinner in the cell array region MC, more memory cells may be stacked. This may improve the degree of integration for memory devices.

Figure 6A:
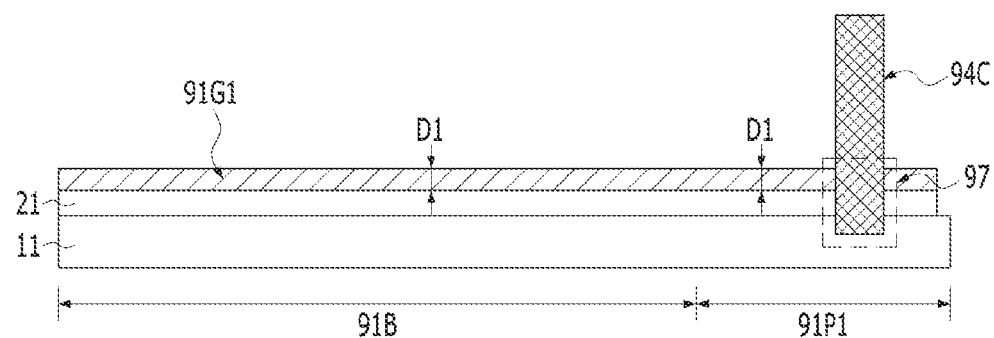
FIGS. 6A and 6B show cross-sectional views illustrating a pad portion according to comparative examples.
Figure 6B:
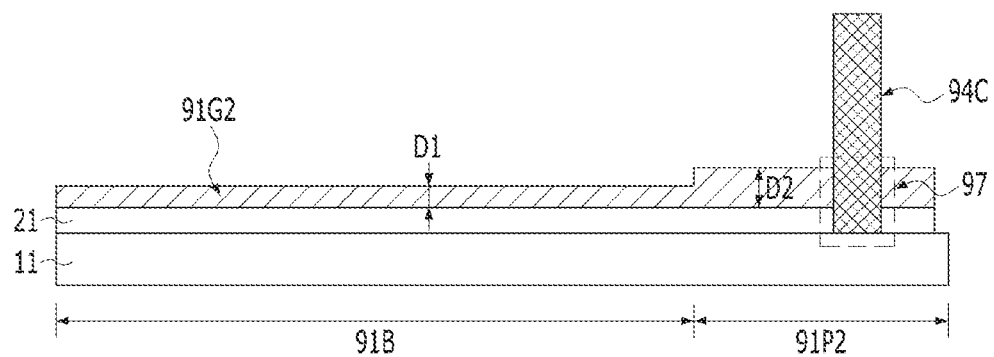

FIGS. 6A and 6B show cross-sectional views illustrating a pad portion according to two embodiments. FIGS. 6A and 6B provide comparative examples of the first gate electrode 91G and the first pad portion 91P of FIG. 5P.

Referring to FIG. 6A, the first gate electrode 91G1 of a first comparative example may include a base portion 91B and a first pad portion 91P1. The base portion 91B and the first pad portion 91P1 of the first gate electrode 91G1 may have the same thickness D1. The first pad portion 91P1 may correspond to the first pad portion 91P of FIG. 5P, but the first pad portion 91P1 may be thinner than the first pad portion 91P of FIG. 5P.

Because the first pad portion 91P1 has a single pad structure and a thin thickness, it is difficult to suppress the punch phenomenon 97 of the first contact plug 94C. The first contact plug 94C may be coupled to the substrate 11, as shown, penetrating through the dielectric layer 21 due to the punch phenomenon 97.

In the first comparative example, the thickness of the first gate electrode 91G1 may be increased to prevent the punch phenomenon of the first pad portion 91P1. However, when the thickness of the first gate electrode 91G1 is increased, there is a limit in stacking memory cells. In contrast, because the pad portion in accordance with the embodiments of the present teachings may be formed in a double pad structure or a triple pad structure, the gate electrode may be formed thin. As a result, the degree of integration of memory cells may be improved.

Referring to FIG. 6B, the first gate electrode 91G2 of a second comparative example may include a base portion 91B and a first pad portion 91P2. The first pad portion 91P2 may be thicker than the base portion 91B (D2>D1). The first pad portion 91P2 may correspond to the first lower pad 91L of the first pad portion 91P of FIG. 5P.

Because the first pad portion 91P2 has a single pad structure, it is difficult to suppress the punch phenomenon 97 of the first contact plug 94C. The first contact plug 94C may be coupled to the substrate 11 through the dielectric layer 21 based on the punch phenomenon 97.

Whereas the first comparative example and the second comparative example both show a single pad structure resulting in the punch phenomenon 97, the first pad portion 91P of FIG. 5P has a double pad structure including the first lower pad 91L and the first upper pad 91U. Therefore, the double pad structure may be advantageous in suppressing the punch phenomenon.

According to the present teachings, when a contact plug is formed, it is possible to protect a pad portion from being punched by forming the pad portion in a multi-layered pad structure at the end of a gate electrode. Therefore, it is possible to prevent a bridge defect that may occur as gate electrodes are penetrated. As a result, semiconductor devices with improved reliability may be provided.

While the present teachings have been described using a limited number of possible embodiments, it will be apparent to those skilled in the art that various changes and modifications may be made to presented embodiments without departing from the spirit and scope of the present teachings as set forth in the following claims.

What is claimed is:
1. A vertical memory device, comprising:
a substrate;

a plurality of gate electrodes vertically stacked over the substrate in a cell array region; and a plurality of multi-layered pad portions formed over the substrate in a contact region, wherein each multi-layered pad portion of the plurality of multi-layered pad portions extends from an end of a gate electrode of the plurality of gate electrodes, and wherein each multi-layered pad portion of the plurality of multi-layered pad portions includes:

a lower pad spaced horizontally apart from an end of a gate electrode;

an upper pad spaced vertically apart from the lower pad;

a buffer pad formed between the lower pad and the upper pad; and a pad interconnection portion positioned between an end of a gate electrode and the lower pad and extending vertically to the upper pad to interconnect the gate electrode, the lower pad, and the upper pad.

2. The vertical memory device of claim 1, wherein the multi-layered pad portions are thicker than the gate electrodes.

3. The vertical memory device of claim 1, wherein the buffer pad is thinner than the lower pad and is thinner than the upper pad.

4. The vertical memory device of claim 1, wherein the lower pad and the upper pad comprise a conductive material, and wherein the buffer pad comprises a dielectric material.

5. The vertical memory device of claim 1, wherein the lower pad and the upper pad have the same thickness, and wherein the lower pad and the upper pad are each thinner than each of the plurality of gate electrodes.

6. The vertical memory device of claim 1, wherein the multi-layered pad portions are formed in a stepwise structure.

7. The vertical memory device of claim 1, wherein the gate electrodes and the multi-layered pad portions are formed of the same material.

8. The vertical memory device of claim 1, further comprising a plurality of vertical channel structures that extend in a direction perpendicular to an upper surface of the substrate and penetrate through the gate electrodes.

9. The vertical memory device of claim 1, further comprising a plurality of dielectric layers interleaved between the plurality of gate electrodes.

10. The vertical memory device of claim 1, further comprising a capping layer that covers the multi-layered pad portions.

11. The vertical memory device of claim 1, further comprising a plurality of contact plugs, wherein contact plugs of the plurality of contact plugs are respectively coupled to multi-layered pad portions of the plurality of multi-layered pad portions.

12. The vertical memory device of claim 1, wherein buffer pad of each pad portion of the plurality of pad portions are discontinuous from each other.

13. The vertical memory device of claim 1, wherein the lower pad and the upper pad have the same thickness, and wherein the lower pad and the upper pad are each thicker than each of the plurality of gate electrodes.

14. The vertical memory device of claim 1, wherein the upper pad is thinner than the lower pad.

15. The vertical memory device of claim 1, wherein the gate electrodes and the upper pad are each thinner than the lower pad, and wherein the gate electrodes is thinner than the upper pad.

16. The vertical memory device of claim 1, wherein the lower pad, the upper pad and the gate electrodes have the same thickness.

17. The vertical memory device of claim 1, wherein the pad interconnection portion comprise a conductive material.

18. The vertical memory device of claim 1, wherein the gate electrodes, the lower pad, the upper pad and the pad interconnection portion are formed of the same material.

19. The vertical memory device of claim 1, further comprising a middle pad positioned between the buffer pad and the upper pad; and an upper buffer pad positioned between the middle pad and the upper pad.

20. The vertical memory device of claim 19, wherein the lower pad, the middle pad and the upper pad have the same thickness.

21. The vertical memory device of claim 19, wherein the middle pad and the upper pad have the same thickness, and wherein the middle pad and the upper pad are each thinner than the lower pad.

22. The vertical memory device of claim 19, wherein the lower pad, the middle pad and the upper pad are each thicker than each of the plurality of gate electrodes.

23. The vertical memory device of claim 19, wherein the buffer pad and the upper buffer pad are each thinner than each of the lower pad, the middle pad and the upper pad.

* * * * *